(12) United States Patent
Kim et al.

(10) Patent No.: US 10,312,074 B2
(45) Date of Patent: Jun. 4, 2019

(54) METHOD OF PRODUCING LAYER STRUCTURE, LAYER STRUCTURE, AND METHOD OF FORMING PATTERNS

(71) Applicant: SAMSUNG SDI CO., LTD., Yongin-si, Gyeonggi-do (KR)

(72) Inventors: Min-Soo Kim, Suwon-si (KR); Hyun-Ji Song, Suwon-si (KR); Sun-Hae Kang, Suwon-si (KR); Sung-Min Kim, Suwon-si (KR); Sung-Hwan Kim, Suwon-si (KR); Young-Min Kim, Suwon-si (KR); Yun-Jun Kim, Suwon-si (KR); Hea-Jung Kim, Suwon-si (KR); Youn-Hee Nam, Suwon-si (KR); Jae-Yeol Baek, Suwon-si (KR); Byeri Yoon, Suwon-si (KR); Yong-Woon Yoon, Suwon-si (KR); Chung-Heon Lee, Suwon-si (KR); Seulgi Jeong, Suwon-si (KR); Yeon-Hee Jo, Suwon-si (KR); Seung-Hee Hong, Suwon-si (KR); Sun-Min Hwang, Suwon-si (KR); Won-Jong Hwang, Suwon-si (KR); Songse Yi, Suwon-si (KR); MyeongKoo Kim, Suwon-si (KR); Naery Yu, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 132 days.

(21) Appl. No.: 14/740,456

(22) Filed: Jun. 16, 2015

(65) Prior Publication Data
US 2016/0126088 A1 May 5, 2016

(30) Foreign Application Priority Data

Oct. 31, 2014 (KR) .......................... 10-2014-0150602

(51) Int. Cl.
| | | |
|---|---|---|
| G03F 7/40 | (2006.01) | |
| H01L 21/02 | (2006.01) | |
| H01L 21/033 | (2006.01) | |
| H01L 21/3105 | (2006.01) | |
| H01L 21/311 | (2006.01) | |
| C08G 10/00 | (2006.01) | |
| C08G 12/00 | (2006.01) | |
| C08G 73/06 | (2006.01) | |
| C08G 61/02 | (2006.01) | |
| C08G 61/12 | (2006.01) | |

(52) U.S. Cl.
CPC ........ *H01L 21/02118* (2013.01); *C08G 10/00* (2013.01); *C08G 12/00* (2013.01); *C08G 73/0672* (2013.01); *G03F 7/40* (2013.01); *H01L 21/02282* (2013.01); *H01L 21/0332* (2013.01); *H01L 21/31058* (2013.01); *H01L 21/31133* (2013.01); *C08G 61/02* (2013.01); *C08G 61/12* (2013.01); *C08G 61/122* (2013.01); *C08G 61/124* (2013.01); *C08G 2261/124* (2013.01); *C08G 2261/135* (2013.01); *C08G 2261/1422* (2013.01); *C08G 2261/314* (2013.01); *C08G 2261/3142* (2013.01); *C08G 2261/3221* (2013.01); *C08G 2261/3241* (2013.01); *C08G 2261/344* (2013.01); *C08G 2261/3424* (2013.01); *C08G 2261/76* (2013.01); *C08G 2261/90* (2013.01)

(58) Field of Classification Search
CPC ......... H01L 21/02293; H01L 21/31058; G03F 7/0035; G03F 7/203
USPC ......................................................... 430/322
See application file for complete search history.

(56) References Cited

U.S. PATENT DOCUMENTS

| | | | | |
|---|---|---|---|---|
| 5,728,626 A | * | 3/1998 | Allman | ................ H01L 21/288 257/E21.174 |
| 7,455,955 B2 | * | 11/2008 | Shih | ........................ B82Y 10/00 257/E21.232 |
| 2003/0054616 A1 | * | 3/2003 | Endisch | ............ H01L 21/02282 438/400 |
| 2005/0285268 A1 | | 12/2005 | Hsu et al. | |
| 2007/0100084 A1 | * | 5/2007 | Sung | .......................... C08F 8/42 525/342 |

FOREIGN PATENT DOCUMENTS

| | | |
|---|---|---|
| CN | 1988132 A | 6/2007 |
| CN | 101355048 A | 1/2009 |
| JP | 07-226356 | 8/1995 |
| JP | 08-107056 | 4/1996 |
| JP | 2005532576 A | 10/2005 |
| JP | 4819016 B2 | 11/2011 |
| JP | 4868840 B2 | 2/2012 |
| JP | 4880652 B2 | 2/2012 |

(Continued)

OTHER PUBLICATIONS

Taiwanese Search Report dated Jan. 6, 2017.
Search Report dated Sep. 25, 2017 of the corresponding Chinese Patent Application No. 201510426921.9.

*Primary Examiner* — Daborah Chacko-Davis
(74) *Attorney, Agent, or Firm* — Lee & Morse, P.C.

(57) ABSTRACT

A method of producing a layer structure includes forming a first organic layer by applying a first composition including an organic compound on a substrate having a plurality of patterns, applying a solvent on the first organic layer to remove a part of the first organic layer, and applying a second composition including an organic compound on a remaining part of the first organic layer and forming a second organic layer through a curing process.

31 Claims, 6 Drawing Sheets

(56) References Cited

FOREIGN PATENT DOCUMENTS

| | | |
|---|---|---|
| JP | 2012-054342 | 3/2012 |
| KR | 10-2001-0028558 A | 4/2001 |
| KR | 10-0688759 | 2/2007 |
| KR | 10-2009-0000428 A | 1/2009 |
| KR | 10-2012-0071856 | 7/2012 |
| KR | 10-2014-0115172 | 9/2014 |
| TW | 200405122 | 4/2004 |
| TW | 200424779 | 11/2004 |
| TW | 201425384 | 7/2014 |

* cited by examiner

[Calculation Equation 1]

Sum of Steps = |h0-h1| + |h0-h2| + |h0-h3| + |h0-h4|

METHOD OF PRODUCING LAYER STRUCTURE, LAYER STRUCTURE, AND METHOD OF FORMING PATTERNS

CROSS-REFERENCE TO RELATED APPLICATION

Korean Patent Application No. 10-2014-0150602, filed on Oct. 31, 2014, in the Korean Intellectual Property Office, and entitled: "Method of Producing Layer Structure, Layer Structure, and Method of Forming Patterns," is incorporated by reference herein in its entirety.

BACKGROUND

1. Field

Embodiments relate to a method of producing a layer structure and a method of forming patterns.

2. Description of the Related Art

A general lithographic technique includes providing a material layer on a semiconductor substrate; coating a photoresist layer thereon; exposing and developing the same to provide a photoresist pattern; and etching the material layer using the photoresist pattern as a mask.

SUMMARY

Embodiments are directed to a method of producing a layer structure including forming a first organic layer by applying a first composition including an organic compound on a substrate having a plurality of patterns, applying a solvent on the first organic layer to remove a part of the first organic layer, and applying a second composition including an organic compound on a remaining part of the first organic layer and forming a second organic layer through a curing process.

The remaining part of the first organic layer may be present inside a gap of the pattern.

The solvent may have solubility for the organic compound of the first composition.

The solvent may include γ-butyrolactone, δ-valerolactone, ethyllactate, ethyl-3-ethoxypropionate, propylene glycolmonomethyl ether acetate, β-hydroxy β-methylbutyrate, methanol, ethanol, 1-propyl alcohol, 2-propyl alcohol, 2-butanol, ethylene glycol, propylene glycol, glycerol, 1,6-hexanediol, cyclo hexanediol, sorbitol, xylitol, 2-methyl-2, 4-pentanediol, 1,3-butanediol, 1,4-butanediol, ethylene glycol monomethyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, diethylene glycol monobutyl ether, propylene glycol monomethyl ether acetate, ethylethoxy propionate, propylene glycol monomethyl ether propionate, ethylene glycol diacetate, ethyl lactate, butyl lactate, methyl 2-hydroxyisobutyrate, n-butyl acetate, formamide, monomethylformamide, dimethyl formamide, acetamide, monomethyl acetamide, dimethyl acetamide, monoethylacetamide, diethyl acetamide, N-methylpyrrolidone, methoxy methyl propionate, methoxy ethyl propionate, methoxy propyl propionate, methoxy butyl propionate, ethoxy methyl propionate, ethoxy ethylpropionate, ethoxy propyl propionate, ethoxy butyl propionate, dimethyl sulfone, dimethyl sulfoxide, sulfolane, acetone, acetyl acetone, methylethyl ketone, methyl isobutyl ketone, or a combination thereof.

The solvent may be applied in an amount of about 0.1 cc to about 100 cc.

The solvent may be applied by spin-on coating, screen printing, slit coating, dipping, inkjet printing, casting, or spray coating.

Forming the first organic layer further may include curing the first composition applied on the substrate.

Curing after applying the first composition and curing after applying the second composition may independently include applying energy selected from heat, ultraviolet (UV) light, microwaves, sound waves, ultrasonic waves, or a combination thereof.

Curing after applying the second composition may be performed at a higher temperature than curing after applying the first composition.

Curing after applying the second composition may include a first curing at about 20 to about 400° C. and a second curing at about 30 to about 500° C. The second curing temperature may be higher than the first curing temperature.

The organic compound of the first composition may have a carbon content of about 60 atomic % to about 96 atomic %. The organic compound of the second composition may have a carbon content of about 60 atomic % to about 96 atomic %.

The organic compound of the first composition and the organic compound of the second composition may independently include at least one substituted or unsubstituted aromatic cyclic group, a substituted or unsubstituted aliphatic cyclic group, a substituted or unsubstituted hetero aromatic cyclic group, a substituted or unsubstituted hetero aliphatic cyclic group, or a combination thereof.

The organic compound of the first composition and the organic compound of the second composition may independently include an organic polymer, an organic monomer, or a combination thereof.

At least one of the organic compound of the first composition and the organic compound of the second composition may include the organic polymer. The organic polymer may have a weight average molecular weight of about 500 to about 200,000.

At least one of the organic compound of the first composition and the organic compound of the second composition may include the organic monomer. The organic monomer may have a molecular weight of about 50 to about 5,000.

At least one of the first composition and the second composition may include an additive.

The first composition may include about 0.001 to 40 parts by weight of the additive based on 100 parts by weight of the first composition. The second composition may include about 0.001 to 40 parts by weight of the additive based on 100 parts by weight of the second composition.

The additive may include a surfactant, a plasticizer, a cross-linking agent, a thermal acid generator (TAG), a photoacid generator (PAG), or a combination thereof.

The additive may include the cross-linking agent. The cross-linking agent may include methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, methoxymethylated thiourea, methoxymethylatedbenzene, butoxymethylatedbenzene, methoxymethylated phenol, butoxymethylated phenol, or a combination thereof.

The first composition may further include a first solvent. The second composition may further include a second solvent. The first solvent and the second solvent may each independently include propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, ethyl 3-ethoxypropionate, or a combination thereof.

The first organic layer and the second organic layer may be hardmask layers.

The first composition and the second composition may be independently applied to a thickness of about 300 Å to about 10 μm.

The first composition and the second composition may be applied by spin-on coating, screen printing, slit coating, dipping, inkjet printing, casting, or spray coating.

One surface of the substrate may include a first part having a plurality of patterns and a second part having no pattern. A sum of steps of the second organic layer may be smaller than a sum of steps of the first organic layer.

A layer structure may be obtained by the method described above.

Embodiments are also directed to a method of forming patterns including providing a layer structure obtained by the method described above, forming a silicon-containing thin layer on the layer structure, forming a photoresist layer on the silicon-containing thin layer, exposing and developing the photoresist layer to form a photoresist pattern, and selectively removing the silicon-containing thin layer and the first organic layer, the second organic layer, or a combination thereof in the layer structure using the photoresist pattern.

The method may further include forming a material layer on the substrate before forming the first organic layer.

The process of selectively removing the silicon-containing thin layer and the first organic layer, the second organic layer, or a combination thereof in the layer structure may further include etching an exposed material layer part.

The method may further include forming a bottom anti-reflective coating (BARC) before forming the photoresist layer.

The silicon-containing thin layer may include SiCN, SiOC, SiON, SiOCN, SiC, SiN, or a combination thereof.

A semiconductor device may be produced according to the method of forming patterns as described above.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
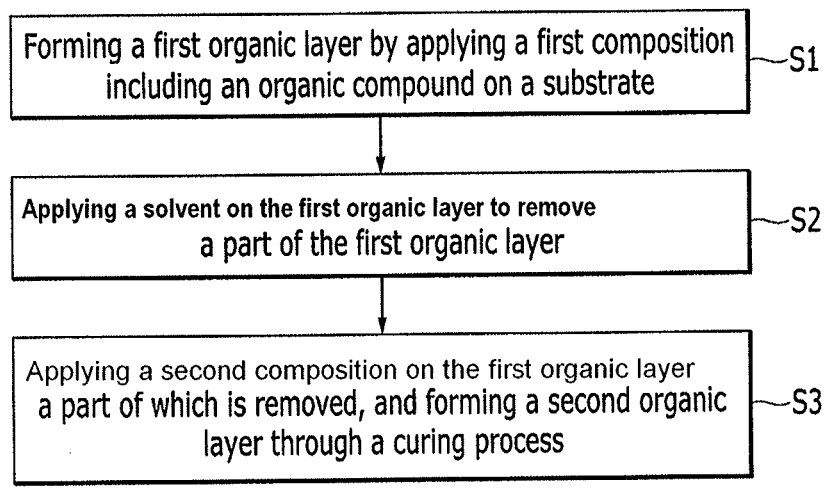
FIG. 1 illustrates a flowchart for explaining a method of producing a layer structure according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

As used herein, when a definition is not otherwise provided, the term 'substituted' may refer to one substituted with a substituent selected from a halogen (F, Br, Cl, or I), a hydroxy group, an alkoxy group, a nitro group, a cyano group, an amino group, an azido group, an amidino group, a hydrazino group, a hydrazono group, carbonyl group, a carbamyl group, a thiol group, ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, C2 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

Hereinafter, a method of producing a layer structure according to an embodiment is described referring to FIG. 1.

FIG. 1 is a flowchart for explaining a method of producing a layer structure according to an embodiment.

Referring to FIG. 1, the method of producing a layer structure may include forming a first organic layer by applying a first composition including an organic compound on a substrate having a plurality of patterns (S1), applying a solvent on the first organic layer to remove a part of the first organic layer (S2), and applying a second composition including an organic compound on the first organic layer a part of which is removed and forming a second organic layer through a curing process (S3).

The substrate may include, for example, a silicon wafer, a glass substrate, or a polymer substrate. The substrate may be obtained by laminating silicon oxide, silicon nitride, TiSi, silicide, polysilicon tungsten, copper, aluminum, TiN, TaN, or a combination thereof on the glass substrate, or the polymer substrate.

The substrate may include a plurality of patterns on one side. The patterns may have a shape of triangle, quadrangle, circle, or the like, as examples. As examples, the patterns may have an average (width) size ranging from several nanometers to hundreds of nanometers and an average (length, depth) size ranging from several nanometers to hundreds of nanometers. In the present specification, the terms 'the gap of patterns' or 'inside the gap of patterns' indicates an empty space formed between first and second patterns neighboring each other, and the pattern gaps may have an average (width) size, for example, ranging from several nanometers to hundreds of nanometers and an average (length, depth) size, for example, ranging from for example several nanometers to tens of micrometers.

Forming the first organic layer (S 1) may further include curing the first composition applied on the substrate. The curing of the first composition may further include applying energy to the first composition. The energy may be a suitable form of energy to cure the first composition, such as thermal energy, an ultraviolet (UV), a microwave, a sound wave, an ultrasonic wave, or the like. The first composition may more fill a plurality of gaps among patterns through the curing.

For example, the curing of the first composition may be for example performed at about 20 to about 400° C.

Hereinafter, an organic compound included in the first composition is illustrated.

The organic compound may include about 60 atomic % to about 96 atomic % of carbon, based on the total weight. The organic compound may include an organic polymer or an organic monomer or, a blended form of the organic polymer and the organic monomer.

The organic polymer may have, for example, a weight average molecular weight ranging from about 500 to about 200,000, or, for example, about 1,000 to about 100,000 The organic monomer may have, for example, a molecular weight ranging from about 250 to about 5,000, or, for example, about 500 to about 3,000.

For example, the organic compound may include at least one substituted or unsubstituted aromatic cyclic group, a substituted or unsubstituted aliphatic cyclic group, a substituted or unsubstituted hetero aromatic cyclic group, a substituted or unsubstituted hetero aliphatic cyclic group, or a combination thereof. In this case, etch resistance and dissolubility for a solvent of the first organic layer may furthermore be improved.

For example, the organic compound may include a monovalent or divalent organic group derived from a substituted or unsubstituted cyclic group selected from the following Group 1.

[Group 1]

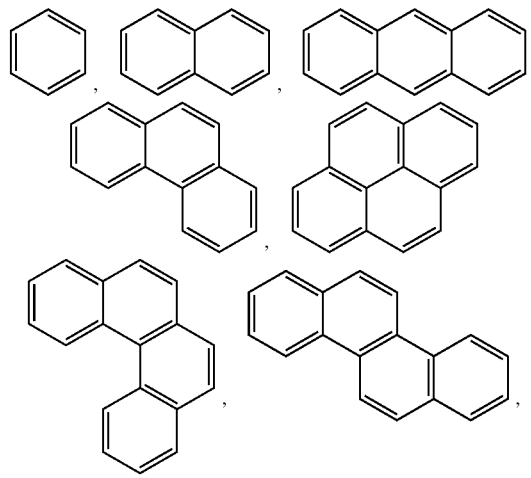

-continued

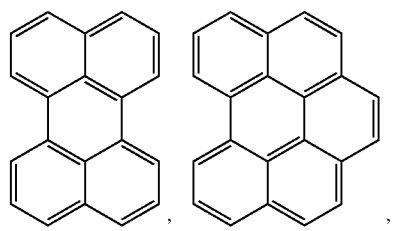

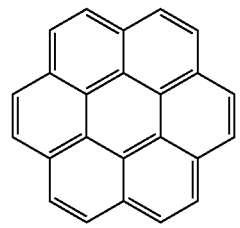

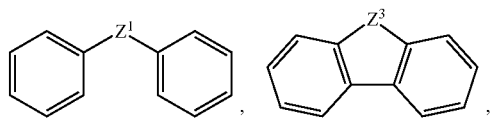

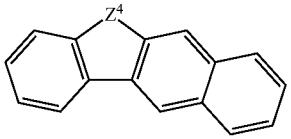

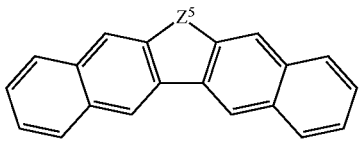

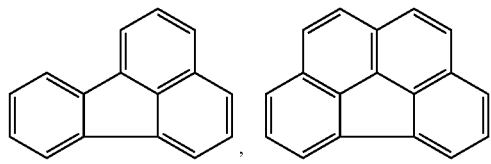

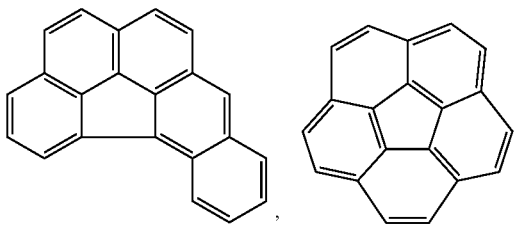

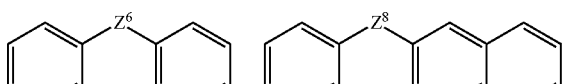

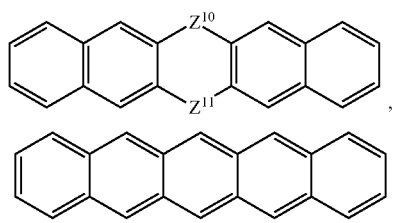

-continued

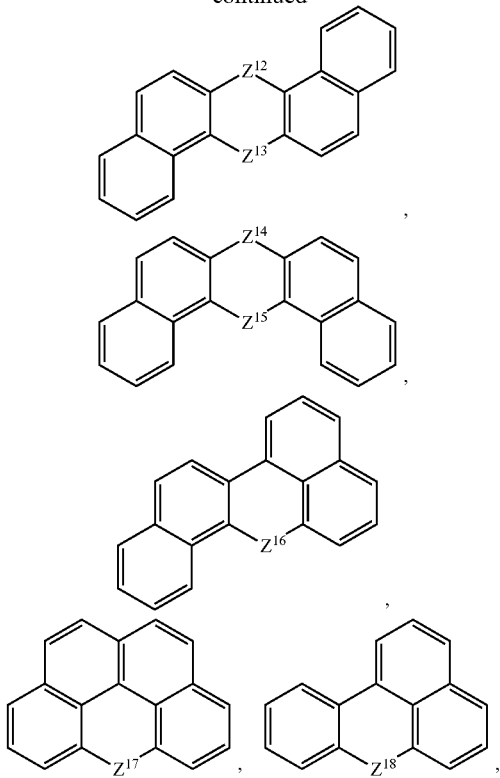

In Group 1, $Z^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkynylene group, a substituted or unsubstituted C2 to C20 alkynylene group, C=O, NR$^a$, oxygen (O), sulfur (S), or a combination thereof, wherein R$^a$ is hydrogen, a substituted or unsubstituted C1 to C10 alkyl group, a substituted or unsubstituted C6 to C20 arylene group, a substituted or unsubstituted C2 to C20 heteroarylene group, a halogen atom, or a combination thereof, and $Z^3$ to $Z^{18}$ are independently C=O, NR$^a$, oxygen (O), sulfur (S), CR$^b$R$^c$, or a combination thereof, wherein R$^a$ to R$^c$ are each independently hydrogen, a substituted or unsubstituted C1 to C10 alkyl group, a substituted or unsubstituted C6 to C20 arylene group, a substituted or unsubstituted C2 to C20 heteroarylene group, a halogen atom, a halogen-containing group, or a combination thereof.

Herein, the term 'a monovalent group derived from a compound A' denotes a monovalent group with one hydrogen substituted in the compound A. For example, a monovalent group derived from a benzene group becomes a phenyl group. In addition, 'a divalent group derived from the compound A' denotes a divalent group with two hydrogens substituted in the compound A and having two contact points. For example, a divalent group derived from a benzene group becomes a phenylene group.

When the kind and the number of the functional groups of the organic compound are selected, properties of the first composition may further be controlled. The functional group may be selected from a hydroxy group, a halogen atom, a halogen-containing group, a thionyl group, a thiol group, a cyano group, a substituted or unsubstituted amino group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C1 to C4 alkyl ether, a substituted or unsubstituted C7 to C20 arylalkylene ether, a substituted or unsubstituted C1 to C30 haloalkyl group, a substituted or unsubstituted C1 to C20 alkylborane group, and a substituted or unsubstituted C6 to C30 arylborane group, but is not limited thereto.

The first composition may further include a solvent. The solvent may be a suitable solvent having sufficient dissolution or dispersion for the organic compound. For example, the solvent may be, for example at least one selected from propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, N,N-dimethyl formamide, N,N-dimethyl acetamide, methylpyrrolidone, methylpyrrolidinone, acetylacetone, and ethyl 3-ethoxypropionate.

The organic compound may be included in an amount of about 0.1 to 60 wt % based on the total amount of the first composition. When the compound is included in the above range, a thickness, surface roughness and planarization of the first organic layer may be controlled.

The first composition may further include, for example an additive such as a surfactant, a plasticizer, a cross-linking agent, a thermal acid generator (TAG), a photoacid generator (PAG).

The surfactant may include, for example, alkylbenzene sulfonate salt, alkyl pyridinium salt, polyethylene glycol, or a quaternary ammonium salt.

The plasticizer may include, for example DOP (dioctylphthalate), DOA (dioctyladipate), TCP (tricresyl phosphate), DIOP (diisocctyl phthalate), DL79P (diheptyl, nonyl phthalate) DINP (diisononyl phthalate), DUP (diundecyl phthalate), BBP (butyl benzyl phthalate), DOA (di-2-ethyl hexyl adipate), DIDA (diisodecyl adipate), DOZ (di-2-ethylhexyl sebacate), DIOZ (diisooctyl azelate), DOS (dioctyl sebacate), TOP (tri-2-ethylhexyl phosphate), TTP (triphenyl phosphate), CDP (cresyldiphenyl phosphate), TCP (tricresyl phosphate), TXP (trixylyl phosphate), TOTM (tri-2-ethylhexyl trimellitate), polyethylene glycol ester, ASE (alkylsulfonic acid phenyl ester), 3G6 (triethylene glycol dihexanoate), 4g7(tetraethylene glycol diheptanoate), ATEC (acetyl triethyl citrate), TBC (tributyl citrate), TOC (trioctyl citrate), ATEC (acetyl trioctyl citrate), ATHC (acetyl trihexyl citrate), TMC (trimethyl citrate), DMAD (dimethyl adipate, MMAD (monomethyl adipate), DBM (dibutyl maleate), DIBM (diisobutyl maleate), BDNPF (bis(2,2-dinitropropyl) formal), TNEN (2,2,2-trinitroethyl 2-nitroxyethyl ether) polyethylene glycol, polypropylene, or a combination thereof.

The cross-linking agent may include, for example a melamine-based cross-linking agent, a substituted urea-based cross-linking agent, or polymers thereof. For example, a cross-linking agent having at least two cross-linking formable substituent may include, for example, methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, methoxymethylated thiourea, methoxymethylatedbenzene, butoxymethylatedbenzene, methoxymethylated phenol, butoxymethylated phenol or a combination thereof.

The thermal acid generator may include, for example an organic sulfonic acid alkylester compound such as benzointosylate and 2-nitro benzyl tosylate and the like, an onium compound such as diphenyliodonium trifluoromethane sulfonate, diphenyliodonium dodecyl benzenesulfonate, bis(4-tert-butyl phenyl) iodonium camphorsulfonate, bis(4-tert-butyl phenyl) iodonium nonafluoro n-butane sulfonate, bis(4-tert-butyl phenyl) iodonium trifluoromethane sulfonate and triphenylsulfonium trifluoromethane sulfonate, and the like. In addition, it may be 2,4,4,6-tetrabromo cyclohexadienone, phenyl-bis(trichloro methyl)-s-triazine and N-hydroxysuccinimide trifluoromethane sulfonate, pyridinium p-toluenesulfonate or a combination thereof.

The photoacid generator may include, for example triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonate, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium (PFOS), methoxydiphenyliodonium (PFOS), di-t-butyldiphenyliodonium triflate, N-hydroxysuccinimide (PFOS), norbornene-dicarboximide (PFOS), or a combination thereof.

The additive may be included within a suitable amount range to improve gap-fill and etch performance as well as solubility without changing optical properties of the first composition. For example, the additive may be included in an amount of about 0.001 to about 40 parts by weight based on 100 parts by weight of the first composition.

The first composition may be coated by a method of screen printing, slit coating, dipping, inkjet, casting or spraying, as well spin-on coating, to have a thickness of, for example, about 300 Å to about 10 μm.

Next, removing a part of the first organic layer is illustrated (S2).

The part of the first organic layer may be dissolved in a solvent and removed and thus, the first organic layer may be planarized.

The solvent may include a suitable solvent to dissolve the organic compound included in the first organic layer. For example, the solvent may be an organic solvent.

For example, the solvent may include γ-butyrolactone, δ-valerolactone, ethyllactate, ethyl-3-ethoxypropionate, propylene glycol mono methylether acetate, β-hydroxy β-methylbutyrate, or a combination thereof.

For example, the solvent may include a solvent listed below:

an alcohol based solvent such as methanol, ethanol, 1-propyl alcohol, 2-propyl alcohol, 2-butanol, ethylene glycol, propylene glycol, glycerol, 1,6-hexanediol, cyclo hexanediol, sorbitol, xylitol, 2-methyl-2,4-pentanediol, 1,3-butanediol and 1,4-butanediol, or the like;

an ether based solvent such as ethylene glycol monomethyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, diethylene glycol monobutyl ether and diethylene glycol monobutyl ether, or the like;

an ester based solvent such as propylene glycol monomethyl ether acetate, ethylethoxy propionate, propylene glycol monomethyl ether propionate, ethylene glycol diacetate, ethyl lactate, butyl lactate, methyl 2-hydroxyisobutyrate, n-butyl acetate, or the like;

an amide based solvent such as formamide, monomethylformamide, dimethyl formamide, acetamide, monomethylacetamide, dimethyl acetamide, monoethylacetamide, diethylacetamide or N-methylpyrrolidone;

an alkoxy alkyl propionate based solvent such as methoxy methyl propionate, methoxy ethyl propionate, methoxy propyl propionate, methoxy butyl propionate, ethoxy methyl propionate, ethoxy ethylpropionate, ethoxy propyl propionate or ethoxy butyl propionate;

a sulfur-containing solvent such as dimethyl sulfone, dimethyl sulfoxide or sulfolane; and a ketone solvent such as acetone, acetyl acetone, methylethyl ketone, or methyl isobutyl ketone.

The solvent may be used in an amount ranging from about 0.1 cc to about 100 cc and may be dispensed in a method of spin-on coating, screen printing, slit coating, dipping, inkjet, casting or spray coating on the first organic layer. This process may be repeated about 1 to about 10 times with a consideration to a degree of removing the first organic layer. The speed and frequency of the dispensing may be appropriately selected with a consideration to properties of the first composition, a substrate material, a pattern size, or the like.

After removing a part of the first organic layer, a portion of the first organic layer may remain inside the gap of the pattern. The portion of the first organic layer remaining removing a part of the first organic layer may be formed on a part or a whole inside of the gap of patterns.

Forming a second organic layer through a curing process (S3) after applying a second composition including an organic compound on the first organic layer of which a part is removed is illustrated.

The second composition may be applied on the portion of the first organic layer remaining after removing a part of the first organic layer.

Like the organic compound included in the first composition, an organic compound included in the second composition may include about 60 atomic % to about 96 atomic % of carbon. The organic compound may include, for example, an organic polymer, an organic monomer, or a blended form of the organic polymer and the organic monomer.

The organic compound included in the second composition may have the same structure, amount, and the like as the organic compound included in the first composition. The organic compound included in the first composition may be the same as or different from the organic compound included in the second composition.

The second composition may further include a solvent. The solvent may include a suitable solvent having sufficient dissolution or dispersion with respect to the organic com pound. The solvent included in the first composition may be one of the solvents used in the first composition.

The organic compound may be included in an amount of about 0.1 to about 60 wt % based on the entire amount of the second composition. When the organic compound is included within the range, thickness, surface roughness and planarization degree of the second organic layer may be controlled.

The second composition may further include an additive such as a surfactant, a plasticizer, a cross-linking agent, a thermal acid generator (TAG), a photoacid generator (PAG). The kinds and amounts of the additive may be the same as those of the first composition.

The second composition may be applied in a spin-on coating method to a thickness ranging from, for example, about 300 Å to about 10 µm.

The aforementioned second composition may be cured to form a second organic layer after the coating.

The curing of the second composition may include applying energy such as light energy, thermal energy, or the like to the layer structure of the second composition to cure the second composition. The second organic layer formed through the curing may be a hardmask composition carbonized layer or sacrificial layer for a pattern formation following this process. For example, the curing after applying the second composition may be performed at a higher temperature than that of the curing after applying the first composition. The curing after applying the second composition may include a first curing performed in a temperature range of about 20 to about 400° C. and a second curing performed in a temperature range of about 30 to about 500° C. The second curing may be performed at a higher temperature than that of the first curing.

Figure 2:
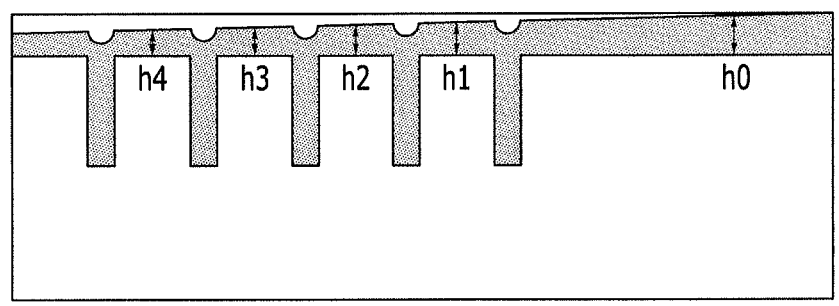
FIG. 2 illustrates a cross-sectional view exemplarily showing the step of a first organic layer.

FIG. 2 is a cross-sectional view exemplarily showing the forming of the first organic layer. Referring to FIG. 2, the first composition may be filled in a pattern gap, but a concavo-convex structure may remain on a part of the surface of the first organic layer.

Figure 3:
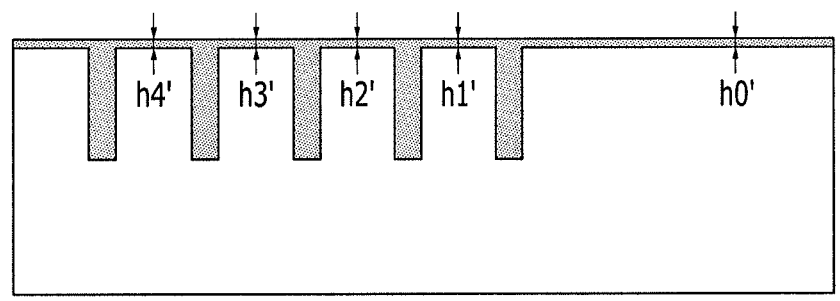
FIGS. 3 to 5 illustrate cross-sectional views exemplarily showing a state that a part of the first organic layer of FIG. 2 is removed.
Figure 4:
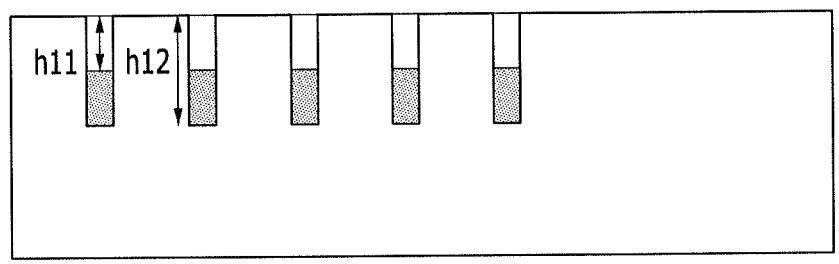
Figure 5:
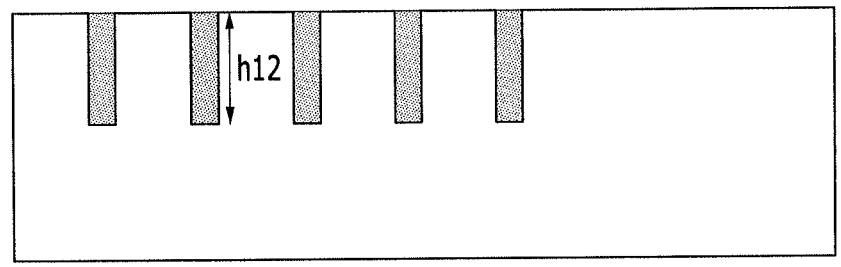

FIGS. 3 to 5 are cross-sectional views showing a state that a part of the first organic layer in FIG. 2 is removed. In FIG. 3, showing the surface of a layer structure in a state that a part of the first organic layer is removed, the first organic layer remains on top of a pattern region having a plurality of patterns and a non-pattern region having no pattern. In FIG. 4, the first organic layer fills a part of a pattern gap (h12>h11≥0). In FIG. 5, the first organic layer fills a whole of the pattern gap but does not remain on the non pattern region as shown in FIG.

The layer structure formed in the aforementioned method may have a minimized step on the surface.

Figure 6:
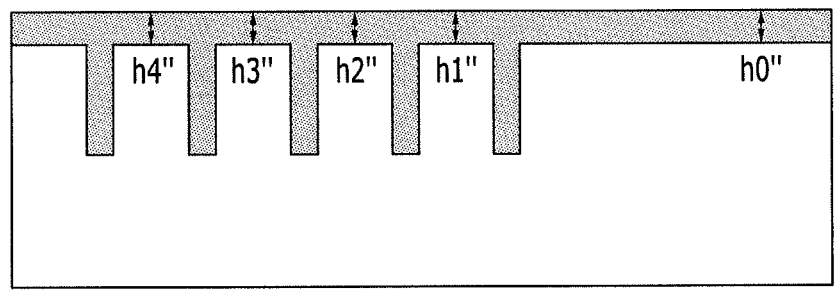
FIG. 6 illustrates a cross-sectional view showing the step of a second organic layer.

FIG. 6 is a cross-sectional view showing the forming of the second organic layer on the first organic layer, after a portion of the first organic layer is removed.

Referring to FIGS. 2 and 6, the sum of steps on the surface of the layer structure in the second organic layer state, that is, $|h0''-h1''|+|h0''-h2''|+|h0''-h3''|+|h0''-h4''|$ may be smaller than the sum of steps on the surface of the layer structure in the first organic layer state of which a part is not removed, that is, not treated with planarization, that is. $|h0-h1|+|h0-h2|+|h0-h3|+|h0-h4|$. Planarization characteristics of the final layer structure after the planarization process by using a solvent may be improved.

According to another embodiment, a layer structure manufactured by the aforementioned method is provided.

In the layer structure, the first and second organic layers may be a hardmask layer. The hardmask layer may have excellent planarization characteristics and thus, may minimize CD errors of a pattern in a pattern-forming process following this process and may improve CD uniformity of the pattern.

Hereinafter, a method of forming patterns according to another embodiment is illustrated referring to FIGS. 7 to 9.

Figure 7:
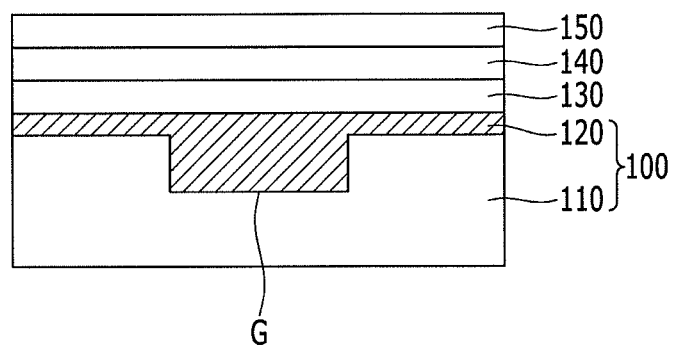
FIGS. 7 to 9 illustrate cross-sectional views depicting a method of forming a pattern according to one embodiment.
Figure 8:
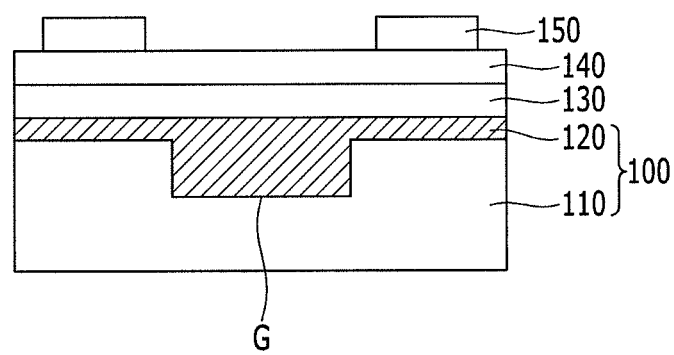
Figure 9:
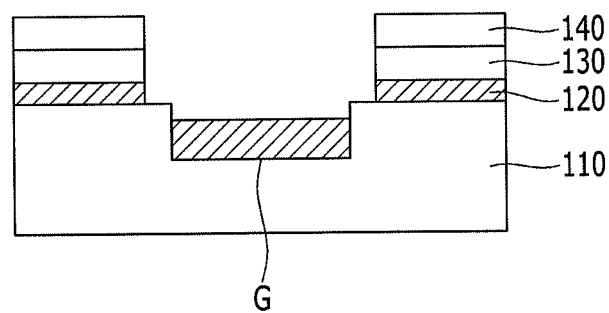

FIGS. 7 to 9 are cross-sectional views for illustrating the method of forming patterns according to an embodiment.

The method of forming patterns may include providing a layer structure including a first organic layer and a second organic layer as described above, forming a silicon-containing thin layer on the second organic layer of the layer structure, forming a photoresist layer on the silicon-containing thin layer, exposing and developing the photoresist layer to form a photoresist pattern, and selectively removing the silicon-containing thin layer and the first organic layer, the second organic layer, or a combination thereof in the layer structure using the photoresist pattern.

Referring to FIG. 7, the organic layer 120 may be the aforementioned first organic layer and/or second organic layer, is the organic layer 120 may be formed on the substrate 110 and may fill a pattern gap (G). On the layer structure 100, the silicon-containing thin layer 130 and the photoresist layer 150 may be sequentially formed. A bottom antireflective coating (BARC) 140 may be further formed before forming the photoresist layer 150. In addition, a material layer may be further formed on the substrate before forming the first organic layer. The material layer may be formed of an ultimately patterned material and may be, for example, a metal layer such as aluminum, copper or the like, a semiconductor layer such as silicon, or an insulation layer such as silicon oxide, silicon nitride or the like. The material layer may be, for example, formed by a chemical vapor deposition (CVD) method.

For example, the silicon-containing thin layer 130 may include SiCN, SiOC, SiON, SiOCN, SiC, SiN, or a combination thereof.

Referring to FIG. 8, the photoresist layer may be exposed and developed, forming a photoresist pattern. The exposure of the photoresist layer may be performed by, for example, using ArF, KrF, EUV or the like. After the exposure, a heat treatment may be performed at about 100 to about 500° C.

Referring to FIG. 9, the silicon-containing thin layer 130 and the organic layer 120 in the layer structure may be selectively removed. Before forming the organic layer 120, the material layer may be formed, and a part of the material layer exposed by selectively removing the silicon-containing thin layer 130 and the organic layer 120 in the layer structure may be etched.

The etched material layer may be formed in a plurality of patterns. The plurality of patterns may be a metal pattern, a semiconductor pattern, an insulation pattern, or the like, or, for example, diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

70 g (0.2 mol) of 4,4'-(9H-fluorene-9,9-diyl)diphenol, 33.2 g (0.2 mol) of 1,4-bis(methoxymethyl)benzene, 70 g of propylene glycol monomethyl ether acetate (PGMEA), and 1.23 g (8 mmol) of diethylsulfate were put in a flask and polymerized while maintained at 110° C. The reaction was finished when a specimen taken from the polymerization reactants by every hour had a weight average molecular weight of 2,500 to 3,000. When the polymerization reaction was complete, the reactant was slowly cooled down to room temperature and added to 30 g of distilled water and 300 g of methanol, and the mixture was strongly agitated and allowed to stand. Then, a precipitate obtained from removing a supernatant therefrom was dissolved in 60 g of propylene glycol monomethyl ether acetate (PGMEA). Subsequently, the solution was strongly agitated by using 250 g of methanol and allowed to stand (a first process). Herein, a precipitate obtained after removing a supernatant again therefrom was dissolved in 60 g of propylene glycol monomethyl ether acetate (PGMEA) (a second process). The first and second processes were regarded as one purification process, and this purification process was performed three times in total. The purified polymer was dissolved in 60 g of propylene glycol monomethyl ether acetate (PGMEA), and then, a polymer (Mw: 3000) represented by Chemical Formula 1a was obtained by removing methanol and distilled water remaining in the solution under a reduced pressure.

[Chemical Formula 1a]

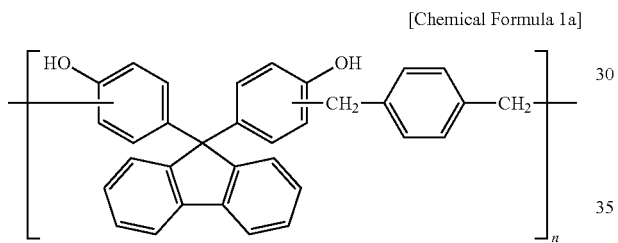

Synthesis Example 2

A polymer (Mw: 3000) represented by the following Chemical Formula 2a was obtained according to the same method as Synthesis Example 1 at 120° C. except for using 20.2 g (0.1 mol) of pyrene, 33.2 g (0.2 mol) of 1,4-bis (methoxymethyl)benzene, 14.4 g (0.1 mol) of 2-naphthol, 0.6 g (4 mmol) of diethylsulfate and 70 g of propylene glycol monomethyl ether acetate (PGMEA).

[Chemical Formula 2a]

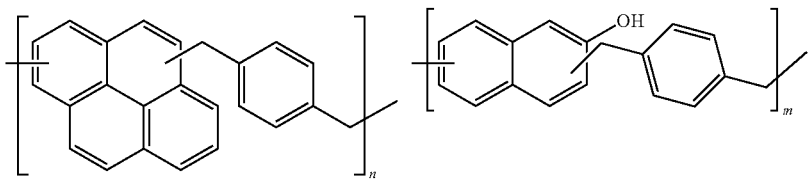

Synthesis Example 3

A polymer (Mw: 3000) represented by the following Chemical Formula 3a was obtained according to the same method as Synthesis Example 1 at 120° C. except for using 16.7 g (0.1 mol) of carbazole, 25.8 g (0.1 mol) of 4,4'-oxybis ((methoxymethyl)benzene), 0.77 g (0.05 mol) of diethyl sulfite and 43 g of monomethyl ether acetate (PGMEA).

[Chemical Formula 3a]

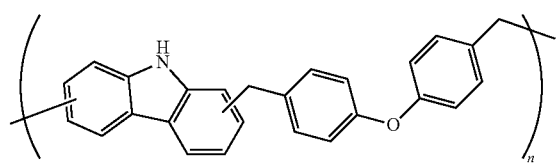

Synthesis Example 4

A polymer (Mw: 3000) represented by the following Chemical Formula 4a was obtained according to the same method as Synthesis Example 1 at 120° C. except for using 16.7 g (0.1 mol) of carbazole, 18 g (0.1 mol) of 9-fluorenone, 19 g (0.1 mol) of p-toluenesulfonic acid monohydrate and 46 g of monomethyl ether acetate (PGMEA).

[Chemical Formula 4a]

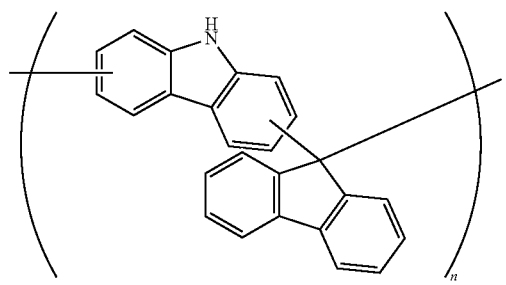

Manufacture of Thin Film

Example 1

A hardmask composition solution was prepared by dissolving 100 parts by weight of the compound represented by the above Chemical Formula 1a, 40 parts by weight of a monomer represented by the following Chemical Formula A (hereinafter, "Monomer 1") and 1 part by weight of p-toluenesulfonic acid monohydrate in a total amount of 10 wt % based on 100 wt % of the entire composition in a solvent (PGMEA/EL=1:1). The solution was spin-on coated onto a silicon wafer and then, soft-baked at 120° C. for 2 minutes, forming a thin film. On this thin film, 2 cc of a mixed solvent (5 wt % of γ-butyrolactone, 20 wt % of ethyl lactate and 75 wt % of ethyl-3-ethoxypropionate) in a spin-on state were injected and removed with a part of the thin film. Then, the hardmask composition was secondarily coated thereon and hard-baked at 400° C. for 2 minutes to be 2,500 Å thick on the bare wafer (thickness measurement: KMAC Inc. (ST5000), hereinafter, the same as in Examples and Comparative Examples).

[Chemical Formula A]

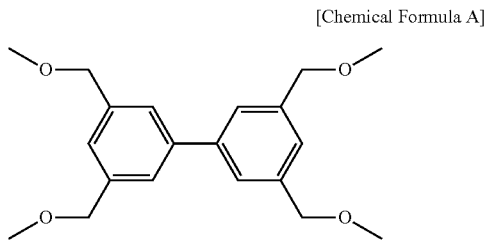

Example 2

A hardmask composition solution was prepared by dissolving 100 parts by weight of the compound represented by the above Chemical Formula 1a and 40 parts by weight of Monomer 1 in a total amount of 10 wt % based on 100 wt % of the entire composition in a solvent (PGMEA/EL=1:1). The obtained solution was spin-on coated onto a silicon wafer and then, soft baked at 150° C. for 2 minutes, forming a thin film. On this thin film, 2 cc of a mixed solvent (5 wt % of γ-butyrolactone, 20 wt % of ethyllactate and 75 wt % of ethyl-3-ethoxypropionate) were injected in a spin-on state and removed with a part of the thin film. Then, the hardmask composition was secondarily coated and hard-baked at 400° C. for 2 minutes to be 2,500 Å thick on the bare wafer.

Example 3

A hardmask composition solution was prepared by dissolving 100 parts by weight of the compound represented by the above Chemical Formula 1a, 30 parts by weight of a monomer represented by the following Chemical Formula B (hereinafter, "monomer 2") and 1 part by weight of p-toluenesulfonic acid monohydrate in a total amount of 10 wt % based on 100 wt % of the entire composition in a solvent (PGMEA/EL=1:1). The solution was spin-on coated onto a patterned wafer and then, soft-basked at 120° C. for 1 minute, forming a thin film. On this thin film, 2 cc of a mixed solvent (5 wt % of γ-butyrolactone, 20 wt % of ethyllactate and 75 wt % of ethyl-3-ethoxypropionate) was injected in a spin-on state and removed with a part of the thin film. Then, the hardmask composition was secondarily coated thereon and hard-baked at 400° C. for 2 minutes to be 2,500 Å thick on the bare wafer.

[Chemical Formula B]

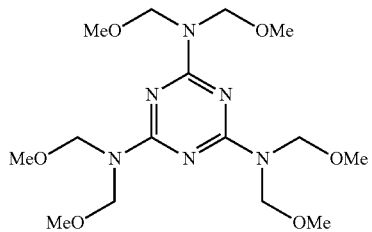

Example 4

A hardmask composition solution was prepared by dissolving 100 parts by weight of the compound represented by the above Chemical Formula 1a and 20 parts by weight of Monomer 1 in a total amount of 10 wt % based on 100 wt % of the entire composition in a solvent (PGMEA/EL=1:1). The solution was spin-on coated onto a silicon wafer and then, soft-baked at 170° C. for 2 minutes, forming a thin film. On this thin film, 2 cc of a mixed solvent (5 wt % of γ-butyrolactone, 20 wt % of ethyllactate and 75 wt % of ethyl-3-ethoxypropionate) was injected in a spin-on state and then removed with a part of the thin film. Then, the hardmask composition was secondarily coated and hard-baked at 400° C. for 2 minutes to be 2,500 Å-thick on the bare wafer.

Example 5

A hardmask composition solution was prepared by dissolving 100 parts by weight of the compound represented by the above Chemical Formula 2a, 40 parts by weight of Monomer 1, and 1 part by weight of p-toluenesulfonic acid monohydrate in a total amount of 10 wt % based on 100 wt % of the entire solvent composition in a solvent (PGMEA/EL=1:1). The solution was spin-on coated on a silicon wafer and soft-baked at 120° C. for 2 minutes, forming a thin film. On this thin film, 5 cc of a mixed solvent (5 wt % of γ-butyrolactone, 20 wt % of ethyllactate and 75 wt % of ethyl-3-ethoxypropionate) was injected in a spin-on state and then, removed with a part of the thin film. Then, the hardmask composition was secondarily coated thereon and hard-baked at 400° C. for 2 minutes to be 2,500 Å-thick on the bare wafer.

Example 6

A hardmask composition solution was prepared by dissolving 100 parts by weight of the compound represented by the above Chemical Formula 2a, 30 parts by weight of Monomer 1 and 1 part by weight of p-toluenesulfonic acid monohydrate in a total amount of 10 wt % based on 100 wt % of the entire composition in a solvent (PGMEA/EL=1:1). The solution was spin-on coated onto a silicon wafer and then, soft-baked at 150° C. for 2 minutes, forming a thin film. On this thin film, 2 cc of a mixed solvent (5 wt % of γ-butyrolactone, 20 wt % of ethyllactate and 75 wt % of ethyl-3-ethoxypropionate) was injected in a spin-on state and then, removed with a part of the thin film. Then, the hardmask composition was secondarily coated and hard-baked at 400° C. for 2 minutes to be 2,500 Å thick on the bare wafer.

Example 7

A hardmask composition solution was prepared by dissolving 100 parts by weight of the compound represented by the above Chemical Formula 3a, 40 parts by weight of Monomer 1 and 1 part by weight of p-toluenesulfonic acid monohydrate in a total amount of 10 wt % based on 100 wt % of the entire composition in a solvent (PGMEA/EL=1:1). The prepared solution was spin-on coated onto a silicon wafer and then soft-baked at 140° C. for 2 minutes, forming a thin film. On this thin film, 2 cc of a mixed solvent (5 wt % of γ-butyrolactate, 20 wt % of ethyllactate and 75 wt % of ethyl-3-ethoxypropionate) was injected in a spin-on state and then, removed with a part of the thin film. Then, the hardmask composition was secondarily coated on the bare wafer and hard-baked at 400° C. for 2 minutes to be 2,500 Å-thick.

Example 8

A hardmask composition solution was prepared by dissolving 100 parts by weight of the compound represented by the above Chemical Formula 4a, 30 parts by weight of Monomer 1 and 1 part by weight of p-toluenesulfonic acid monohydrate in a total amount of 10 wt % based on 100 wt % of the entire composition in a solvent (PGMEA/EL=1:1). The prepared solution was spin-on coated onto a silicon wafer and soft-baked at 140° C. for 2 minutes, forming a thin film. On this thin film, 2 cc of a mixed solvent (5 wt % of γ-butyrolactone, 20 wt % of ethyllactate and 75 wt % of ethyl-3-ethoxypropionate) was injected in a spin-on state and removed with a part of the thin film. Then, the hardmask composition was secondarily coated and hard-baked at 400° C. for 2 minutes to be 2,500 Å thick on the bare wafer.

Comparative Example 1

A hardmask composition solution was prepared by dissolving 100 parts by weight of the compound represented by the above Chemical Formula 1a, 40 parts by weight of Monomer 1 and 1 part by weight of p-toluenesulfonic acid monohydrate in a total amount of 10 wt % based on 100 wt % of the entire composition in a solvent (PGMEA/EL=1:1). The prepared solution was spin-on coated on a silicon wafer and then hard-baked at 400° C. for 2 minutes to be 2,500 Å-thick on the bare wafer.

Comparative Example 2

A hardmask composition solution was prepared by dissolving 100 parts by weight of the compound represented by the above Chemical Formula 1a, 30 parts by weight of Monomer 2 and 1 part by weight of p-toluene sulfonic acid monohydrate in a total amount of 10 wt % based on 100 wt % of the entire composition in a solvent (PGMEA/EL=1:1). The prepared solution was spin-on coated onto a silicon wafer and soft-baked at 400° C. for 2 minutes to be 2,500 Å thick on the bare wafer.

Comparative Example 3

A hardmask composition solution was prepared by mixing 100 parts by weight of the compound represented by the above Chemical Formula 2a, 40 parts by weight of Monomer 1 and 1 part by weight of p-toluene sulfonic acid monohydrate in a total amount of 10 wt % based on 100 wt % of the entire composition in a solvent (PGMEA/EL=1:1). The prepared solution was spin-on coated onto a silicon wafer and hard-baked at 400° C. for 2 minutes to be 2,500 Å thick on the bare wafer.

Comparative Example 4

A hardmask composition solution was prepared by dissolving 100 parts by weight of the compound represented by the above Chemical Formula 2a, 30 parts by weight of Monomer 2 and 1 part by weight of p-toluene sulfonic acid monohydrate in a total amount of 10 wt % based on 100 wt % of the entire composition in a solvent (PGMEA/EL=1:1). The prepared solution was spin-on coated onto a silicon wafer and hard-baked at 400° C. for 2 minutes to be 2,500 Å-thick on the bare wafer.

Planarization Characteristics of Thin Film

Planarization characteristics of the final thin films were evaluated with respect to step and void characteristics. In order to evaluate the step, each hardmask thin film of Examples 1 to 8 and Comparative Example 1 to 4 was formed by coating each hardmask composition on patterned wafers. The patterned wafers had a line width of 50 nm and L/S=1:1, and the patterned wafers had C/H of 1:1 and a hole of 60 nm. Subsequently, the thin films were cut to obtain its cross-section as a sample. Subsequently, the samples were coated with Pt, and then, their steps were examined with FE-SEM (SU-8030, Hitachi Ltd.).

Figure 10:
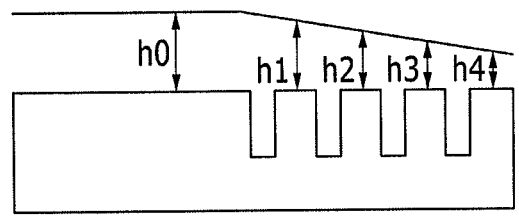
FIG. 10 illustrates a reference view depicting Calculation Equation 1 for evaluating step characteristics.

FIG. 10 is a reference view illustrating Calculation Equation 1 for evaluating step characteristics. Referring to FIG. 10, the planarization characteristics are considered more excellent when a peripheral region having no pattern and a cell region having a pattern have a smaller film thickness difference. When |h0−h1|+|h0−h2|+|h0−h3|+|h0−h4|+ . . . +(h0−hn) (n is the number of pattern) is smaller, the step characteristics are considered more excellent.

FE-SEM with respect to a cross-section of the pattern wafer was used to examine whether the sample had a void. The results are provided in Table 1.

TABLE 1

|  | Step | Void |
| --- | --- | --- |
| Example 1 | 145 | X |
| Example 2 | 87 | X |
| Example 3 | 99 | X |
| Example 4 | 150 | X |
| Example 5 | 122 | X |
| Example 6 | 95 | X |
| Example 7 | 67 | X |
| Example 8 | 98 | X |
| Comparative Example 1 | 450 | X |
| Comparative Example 2 | 480 | X |
| Comparative Example 3 | 380 | X |
| Comparative Example 4 | 380 | X |

Referring to Table 1, each thin film respectively formed of the hardmask compositions according to Examples 1 to 8 showed excellent planarization characteristics compared with each thin film respectively formed of the hardmask compositions according to Comparative Examples 1 to 4.

By way of summation and review, the semiconductor industry has developed an ultrafine technique to provide pattern of several to several tens nanometer size. For such an ultrafine technique, effective lithographic techniques are desirable According to small-sizing the pattern to be formed, it may be difficult to provide a fine pattern having an excellent profile by only a general lithographic technique. Accordingly, an organic layer, called a hardmask layer, may be formed between the material layer and the photoresist layer to provide a fine pattern.

The hardmask layer plays a role of an intermediate layer for transferring the fine pattern of photoresist to the material layer through the selective etching process. Accordingly, it is desirable that the hardmask layer have characteristics such as heat resistance and etch resistance, or the like to be tolerated during multiple etching processes.

In a multiple patterning process, when a substrate has a step or a pattern-dense region or no pattern region is present on a wafer, it may be particularly desirable for a hardmask layer filling patterns to have planarization characteristics in order to minimize steps between patterns. A layer structure being capable of satisfying these characteristics is desirable.

Embodiments provide a method of producing layer structure for forming a multiple pattern structure such as dual damascene interconnection structure and a method of forming patterns using the layer structure.

Embodiments provide a method of producing a layer structure having excellent step and planarization characteristics without a separate etchback process or CMP (chemical mechanical polishing) process. Such a layer structure is desirable for providing a semiconductor fine pattern.

Embodiments provide a layer structure having excellent planarization characteristics and ensuring etch resistance.

Embodiments provide a method of forming patterns using the layer structure.

Embodiments provide a semiconductor device produced by the method of forming patterns Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of producing a layer structure that includes a first organic layer and a second organic layer, the method comprising:
    forming the first organic layer by applying a first composition including an organic compound on a substrate having a plurality of patterns such that the first organic layer is present inside a gap of the patterns;
    applying a solvent on the first organic layer to remove a part of the first organic layer such that a remaining part of the first organic layer is present inside a part of the gap of the patterns; and
    applying a second composition including an organic compound on the remaining part of the first organic layer, wherein the second composition is applied by spin-on coating, and forming the second organic layer through a curing process.

2. The method as claimed in claim 1, wherein the solvent has solubility for the organic compound of the first composition.

3. The method as claimed in claim 1, wherein the solvent includes γ-butyrolactone, δ-valerolactone, ethyllactate, ethyl-3-ethoxypropionate, propylene glycolmonomethyl ether acetate, β-hydroxyl β-methylbutyrate, methanol, ethanol, 1-propyl alcohol, 2-propyl alcohol, 2-butanol, ethylene glycol, propylene glycol, glycerol, 1,6-hexanediol, cyclo hexanediol, sorbitol, xylitol, 2-methyl-2,4-pentanediol, 1,3-butanediol, 1,4-butanediol, ethylene glycol monomethyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, diethylene glycol monobutyl ether, propylene glycol monomethyl ether acetate, ethylethoxy propionate, propylene glycol monomethyl ether propionate, ethylene glycol diacetate, ethyl lactate, butyl lactate, methyl 2-hydroxyisobutyrate, n-butyl acetate, formamide, monomethylformamide, dimethyl formamide, acetamide, monomethylacetamide, dimethyl acetamide, monoethylacetamide, diethylacetamide, N-methyl-pyrrolidone, methoxy methyl propionate, methoxy ethyl propionate, methoxy propyl propionate, methoxy butyl propionate, ethoxy methyl propionate, ethoxy ethylpropionate, ethoxy propyl propionate, ethoxy butyl propionate, dimethyl sulfone, dimethyl sulfoxide, sulfolane, acetone, acetyl acetone, methylethyl ketone, methyl isobutyl ketone, or a combination thereof.

4. The method as claimed in claim 1, wherein the solvent is applied in an amount of about 0.1 cc to about 100 cc.

5. The method as claimed in claim 1, wherein the solvent is applied by spin-on coating, screen printing, slit coating, dipping, inkjet printing, casting, or spray coating.

6. The method as claimed in claim 1, wherein forming the first organic layer further includes curing the first composition applied on the substrate.

7. The method as claimed in claim 6, wherein curing after applying the first composition and curing after applying the second composition independently includes applying energy selected from heat, ultraviolet (UV) light, microwaves, sound waves, ultrasonic waves, or a combination thereof.

8. The method as claimed in claim 6, wherein curing after applying the second composition is performed at a higher temperature than curing after applying the first composition.

9. The method as claimed in claim 8, wherein:
    curing after applying the second composition includes a first curing at about 20 to about 400° C. and a second curing at about 30 to about 500° C., and
    the second curing temperature is higher than the first curing temperature.

10. The method as claimed in claim 1, wherein:
    the organic compound of the first composition has a carbon content of about 60 atomic % to about 96 atomic %, and
    the organic compound of the second composition has a carbon content of about 60 atomic % to about 96 atomic %.

11. The method as claimed in claim 10, wherein the organic compound of the first composition and the organic compound of the second composition independently include at least one substituted or unsubstituted aromatic cyclic group, a substituted or unsubstituted aliphatic cyclic group, a substituted or unsubstituted hetero aromatic cyclic group, a substituted or unsubstituted hetero aliphatic cyclic group, or a combination thereof.

12. The method as claimed in claim 10, wherein the organic compound of the first composition and the organic compound of the second composition independently include an organic polymer, an organic monomer, or a combination thereof.

13. The method as claimed in claim 12, wherein:
    at least one of the organic compound of the first composition and the organic compound of the second composition includes the organic polymer, and
    the organic polymer has a weight average molecular weight of about 500 to about 200,000.

14. The method as claimed in claim 12, wherein:
    at least one of the organic compound of the first composition and the organic compound of the second composition includes the organic monomer, and
    the organic monomer has a molecular weight of about 50 to about 5,000.

15. The method as claimed in claim 12, wherein at least one of the first composition and the second composition includes an additive.

16. The method as claimed in claim 15, wherein:
the first composition includes about 0.001 to 40 parts by weight of the additive based on 100 parts by weight of the first composition, and
the second composition includes about 0.001 to 40 parts by weight of the additive based on 100 parts by weight of the second composition.

17. The method as claimed in claim 15, wherein the additive includes a surfactant, a plasticizer, a cross-linking agent, a thermal acid generator (TAG), a photoacid generator (PAG), or a combination thereof.

18. The method as claimed in claim 17, wherein:
the additive includes the cross-linking agent, and
the cross-linking agent includes methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, methoxymethylated thiourea, methoxymethylatedbenzene, butoxymethylatedbenzene, methoxymethylated phenol, butoxymethylated phenol, or a combination thereof.

19. The method as claimed in claim 12, wherein:
the first composition further includes a first solvent,
the second composition further includes a second solvent, and
the first solvent and the second solvent each independently include propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, ethyl 3-ethoxypropionate, or a combination thereof.

20. The method as claimed in claim 1, wherein the first organic layer and the second organic layer are hardmask layers.

21. The method as claimed in claim 1, wherein the first composition and the second composition are independently applied to a thickness of about 300 Å to about 10 μm.

22. The method as claimed in claim 1, wherein the first composition is applied by spin-on coating, screen printing, slit coating, dipping, inkjet printing, casting, or spray coating.

23. The method as claimed in claim 1, wherein:
one surface of the substrate includes a first part having a plurality of patterns and a second part having no pattern, and
a sum of steps of the second organic layer is smaller than a sum of steps of the first organic layer.

24. A layer structure obtained by the method as claimed in claim 1.

25. A method of forming patterns, the method comprising
providing a layer structure obtained by the method as claimed in claim 1;
forming a silicon-containing thin layer on the layer structure;
forming a photoresist layer on the silicon-containing thin layer;
exposing and developing the photoresist layer to form a photoresist pattern; and
selectively removing the silicon-containing thin layer and the first organic layer, the second organic layer, or a combination thereof in the layer structure using the photoresist pattern.

26. The method as claimed in claim 25, wherein the method further comprises forming a material layer on the substrate before forming the first organic layer.

27. The method as claimed in claim 26, wherein the process of selectively removing the silicon-containing thin layer and the first organic layer, the second organic layer, or a combination thereof in the layer structure further includes etching an exposed material layer part.

28. The method as claimed in claim 25, wherein the method further includes forming a bottom antireflective coating (BARC) before forming the photoresist layer.

29. The method as claimed in claim 25, wherein the silicon-containing thin layer includes SiCN, SiOC, SiON, SiOCN, SiC, SiN, or a combination thereof.

30. A semiconductor device produced according to the method of forming patterns as claimed in claim 25.

31. The method as claimed in claim 1, wherein:
applying the solvent on the first organic layer includes removing a part of the first organic layer from inside the gap of the patterns,
applying the second composition including an organic compound on the remaining part of the first organic layer inside of the gap of the patterns includes applying the second composition inside the gap of the patterns, and
forming the second organic layer includes forming the second organic layer inside the gap of the patterns.

* * * * *